United States Patent
Ahmad

(10) Patent No.: US 6,336,974 B1
(45) Date of Patent: *Jan. 8, 2002

(54) APPARATUS AND METHOD FOR CONTROLLING THE DEPTH OF IMMERSION OF A SEMICONDUCTOR ELEMENT IN AN EXPOSED SURFACE OF A VISCOUS FLUID

(75) Inventor: Syed Sajid Ahmad, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/183,233

(22) Filed: Oct. 29, 1998

Related U.S. Application Data

(60) Division of application No. 09/020,197, filed on Feb. 6, 1998, now Pat. No. 6,040,205, which is a continuation-in-part of application No. 08/906,673, filed on Aug. 5, 1997, now Pat. No. 6,013,535, and a continuation-in-part of application No. 08/906,578, filed on Aug. 5, 1997.

(51) Int. Cl.[7] ................................................ B05C 3/00
(52) U.S. Cl. ........................................ 118/406; 118/683
(58) Field of Search .............................. 118/429, 428, 118/406, 680, 683, 681

(56) References Cited

U.S. PATENT DOCUMENTS

| | | | |
|---|---|---|---|
| 2,506,049 A | * | 5/1950 | Thomas |
| 4,526,740 A | | 7/1985 | Adams et al. |
| 4,862,245 A | | 8/1989 | Pashby et al. |
| 5,183,508 A | * | 2/1993 | Cholinski |
| 5,286,679 A | | 2/1994 | Farnworth et al. |
| 5,322,207 A | | 6/1994 | Fogal et al. |
| 5,409,863 A | | 4/1995 | Newman |
| RE35,027 E | | 8/1995 | Ragard |
| 5,548,160 A | | 8/1996 | Corbett et al. |
| 5,559,046 A | | 9/1996 | Oishi et al. |
| 5,563,443 A | | 10/1996 | Beng et al. |
| 5,617,990 A | | 4/1997 | Thompson, Sr. |
| 5,696,033 A | | 12/1997 | Kinsman |
| 5,885,854 A | | 3/1999 | Wensel |
| 5,901,899 A | * | 5/1999 | Flache |
| 6,010,570 A | * | 1/2000 | Motoda et al. |

* cited by examiner

Primary Examiner—Brenda A. Lamb
(74) Attorney, Agent, or Firm—TraskBritt

(57) ABSTRACT

A method and apparatus for achieving a consistent depth of immersion of a semiconductor element into an exposed surface of an adhesive material pool when applying the adhesive material, conductive or non-conductive, to the semiconductor element or portion thereof. The consistent depth of immersion is defined by a stop which is attached to a reservoir used to form the adhesive material pool, attached to a stencil which is used in conjunction with the reservoir to form a level upper surface on the adhesive material, or operates independently from the reservoir and/or stencil.

23 Claims, 21 Drawing Sheets

APPARATUS AND METHOD FOR CONTROLLING THE DEPTH OF IMMERSION OF A SEMICONDUCTOR ELEMENT IN AN EXPOSED SURFACE OF A VISCOUS FLUID

RELATED APPLICATIONS

This application is a divisional patent application of application Ser. No. 09/020,197 filed Feb. 6, 1998, now U.S. Pat. No. 6,040,205 which is a continuation-in-part of application Ser. No. 08/906,578 filed on Aug. 5, 1997, hereby incorporated herein by reference, and also a continuation-in-part of application Ser. No. 08/906,673 filed on Aug. 5, 1997, now U.S. Pat. No. 6,013,535 hereby incorporated herein by reference.

BACKGROUND OF THE INVENTION

1. Field of the Invention

The present invention relates to applying adhesive material to a semiconductor element by contacting the semiconductor element with a level surface pool of adhesive material. More particularly, the present invention relates to an apparatus and method for controlling the depth of immersion of the semiconductor element into the adhesive material pool.

2. State of the Art

Higher performance, lower cost, increased miniaturization of semiconductor components, and greater packaging density of integrated circuits are ongoing goals of the computer industry. One way to reduce the overall cost of a semiconductor component is to reduce the manufacturing cost of that component. Lower manufacturing costs can be achieved through faster production and/or reduction in the amount of materials used in fabricating the semiconductor component.

One area where faster production and reduction in material usage can be achieved is in the area of lead frame attachment to semiconductor dice. U.S. Pat. No. 5,286,679 issued Feb. 15, 1994 to Farnworth et al. ("the '679 patent"), assigned to the assignee of the present invention and hereby incorporated herein by reference, teaches attaching leads to a semiconductor device with adhesive material in a "lead-over-chip" ("LOC") configuration. The '679 patent teaches applying a patterned thermoplastic or thermoset adhesive layer to a semiconductor wafer. The adhesive layer is patterned to keep the "streets" on the semiconductor wafer clear of adhesive for saw cutting and to keep the wire bonding pads on the individual dice clear of adhesive for wire bonding. Patterning of the adhesive layer is generally accomplished by hot or cold screen/stencil printing or dispensing by roll-on. Following the printing and baking of the adhesive layer on the semiconductor wafer, the individual dice are singulated from the semiconductor wafer. During packaging, each adhesive coated die is attached to lead fingers of a lead frame by heating the adhesive layer and pressing the lead fingers onto the adhesive. If the adhesive layer is formed of a thermoset material, a separate oven cure is required. Furthermore, the adhesive layer may be formulated to function as an additional passivating/insulating layer or alpha barrier for protecting the packaged die.

Although the teaching of the '679 patent is an effective method for attaching leads in a LOC configuration, it is difficult to achieve an adequate profile on the adhesive such that there is sufficient area on the top of the adhesive to attach the lead fingers. The process disclosed in the '679 patent is illustrated in FIGS. 43–49. FIG. 43 illustrates a side, cross-sectional view of a semiconductor substrate 302 with a bond pad 304, wherein a stencil or a screen print template 306 has been placed over the semiconductor substrate 302, generally a silicon wafer. The stencil or screen print template 306 is patterned to clear the area around the bond pads 304 and to clear street areas 308 for saw cutting (i-e., for singulating the substrate into individual dice). An adhesive material 310 is applied to the stencil or screen print template 306, as shown in FIG. 44. Ideally, when the stencil or screen print template 306 is removed, adhesive prints 312 are formed with vertical sidewalls 314 and a planar upper surface 316, as shown in FIG. 45. However, since the adhesive material 310 must have sufficiently low viscosity to flow and fill the stencil or screen print template 306, as well as allow for the removal of the stencil or screen print template 306 without the adhesive material 310 sticking thereto, the adhesive material 310 of the adhesive prints 312 will spread, sag, or flow laterally under the force of gravity after the removal of the stencil or screen print template 306, as shown in FIG. 46. This post-application flow of adhesive material 310 can potentially cover all or a portion of the bond pads 304 or interfere with the singulating of the semiconductor wafer by flowing into the street areas 308.

Furthermore, and of even greater potential consequence than bond pad or street interference is the effect that the lateral flow or spread of adhesive material 310 has on the adhesive material upper surface 316. As shown in FIG. 47, the adhesive material upper surface 316 is the contact area for lead fingers 318 of a lead frame 320. The gravity-induced flow of the adhesive material 310 causes the once relatively well defined edges 322 of the adhesive material to curve, resulting in a loss of surface area 324 (ideal shape shown in shadow) for the lead fingers 318 in which to attach. This loss of surface area 324 is particularly problematical for the adhesive material upper surface 316 at the longitudinal ends 326 thereof. At the adhesive material longitudinal ends 326, the adhesive material flows in three directions (to both sides as well as longitudinally), causing a severe curvature 328, as shown in FIGS. 48 and 49. The longitudinal ends of the adhesive print on patch flow in a 180° flow front, result in blurring of the print boundaries into a curved perimeter. This curvature 328 results in complete or near complete loss of effective surface area on the adhesive material upper surface 316 for adhering the outermost lead finger closest to the adhesive material end 326 (lead finger 330). This results in what is known as a "dangling lead". Since the lead finger 330 is not adequately attached to the adhesive material end 326, the lead finger 330 will move or bounce when a wirebonding apparatus (not shown) attempts to attach a bond wire (not shown) between the lead finger 330 and its respective bond pad 304 (shown from the side in FIG. 48). This movement can cause inadequate bonding or non-bonding between the bond wire and the lead finger 330, resulting in the failure of the component due to a defective electrical connection.

LOC attachment can also be achieved by attaching adhesive tape, preferably insulative, to an active surface of a semiconductor die, then attaching lead fingers to the insulative tape. As shown in FIG. 50, two strips of adhesive tape 410 and 410' are attached to an active surface 412 of a semiconductor die 404. The two adhesive tape strips 410, 410' run parallel to and on opposing sides of a row of bond pads 406. Lead fingers 402, 402' are then attached to the two adhesive tape strips 410, 410', respectively. The lead fingers 402, 402' are then electrically attached to the bond pads 406 with bond wires 408. Although this method is effective in attaching the lead fingers 402, 402' to the semiconductor die 404, this method is less cost effective than using adhesive since the cost of adhesive tape is higher than the cost of adhesive material. The higher cost of the adhesive tape is a result of the manufacturing and placement steps which are required with adhesive tapes. The individual tape segments are generally cut from a larger tape sheet. This cutting requires precision punches with extremely sharp and accurate edges. These precision punches are expensive and they wear out over time. Furthermore, there is always waste between the segments which are punched out, resulting in high scrap cost. Moreover, once punch out is complete, the tape segments are placed on a carrier film for transport to the die-attach site. Thus, there are problems with placement, alignment, and attachment with film carriers, plus the cost of the film carrier itself. LOC attachment can further be achieved by placing adhesive material on the lead fingers of the lead frame rather than on the semiconductor substrate. As shown in FIG. 51, the adhesive material 502 may be spray applied on an attachment surface 504 of lead fingers 506. However, the viscous nature of the adhesive material 502 results in the adhesive material 502 flowing down the sides 508 of the lead finger 506 and collecting on the reverse, bond wire surface 510 of the lead finger 506, as shown in FIG. 52. The adhesive material 502 which collects and cures on the bond wire surface 510 interferes with subsequent wirebonding, which, in turn, can result in a failure of the semiconductor component. The flow of adhesive material 502 from the attachment surface 504 to the bond wire surface 510 can be exacerbated if the lead fingers 506 are formed by a stamping process rather than by etching, the other widely employed alternative. The stamping process leaves a slight curvature 512 to edges 514 of at least one surface of the lead finger 506, as shown in FIG. 53. If an edge curvature 512 is proximate the lead finger attachment surface 504, the edge curvature 512 results in less resistance (i.e., less surface tension) to the flow of the adhesive material 502. This, of course, results in the potential for a greater amount of adhesive material 502 to flow to the bond wire surface 510.

Furthermore, present methods of adhesive material application on a surface (whether the semiconductor die or the lead fingers) tend to waste adhesive material. For example, spray application loses a great deal of adhesive material because not all of the sprayed adhesive material attaches to the target surface. As another example, the patterning of an adhesive layer on a semiconductor die, such as described in the '679 patent, results in a substantial area of the adhesive pattern not being utilized to attach leads.

Thus, it can be appreciated that it would be advantageous to develop a method and apparatus for rapidly applying an adhesive material to a lead finger with little waste of adhesive material.

SUMMARY OF THE INVENTION

The present invention relates to a method for applying an adhesive material to lead fingers of a lead frame wherein surfaces of the lead fingers which receive the adhesive material face downward to contact a pool of adhesive material. Preferably, the adhesive material cures with the lead frame in this downward-facing position. The advantages of placing viscous material, such as an adhesive material, in a downward-facing position is described in U.S. patent application Ser. No. 08/709,182 by Tongbi Jiang and Syed S. Ahmad filed Sep. 6, 1996, assigned to the assignee of the present invention and hereby incorporated herein by reference. An adhesive reservoir retaining the adhesive material can be shaped such that the exposed surface (pool) of the adhesive material is in a precise location. When the lead fingers contact the exposed surface of the adhesive material, the adhesive material attaches to only specific, desired portions of the lead fingers.

Rather than gravitational forces causing the adhesive material to flow and expand as when the adhesive material is placed on top of the lead frame, the gravitational forces on the inverted lead frame maintain the shape and boundary definition of the adhesive material. It is, of course, understood that the viscous adhesive material must be compatible with the lead finger material so as to adhere thereto and must not be of such a low viscosity that it drips when the lead fingers are removed from contact with the adhesive material pool. Preferably, the viscous materials have viscosities between about 1000 cps and 500,000 cps.

Of critical importance to the application of the adhesive material to the lead fingers in the method described above is the levelness of the exposed surface of the adhesive material of the pool. If the exposed surface is not level, the lead fingers may extend too deeply into the adhesive material. When this occurs, the adhesive material may wet sides of the lead finger and may even wet a bond wire surface of the lead finger. If the adhesive material wets the bond wire surface, the adhesive material may interfere with a wirebonding step subsequent to LOC attachment of the lead fingers to an active surface of a semiconductor die.

The parent application hereto, U.S. Pat. application Ser. No. 08/906,578 by Walter L. Moden, Syed S. Ahmed, Gregory M. Chapman, and Tongbi Jiang filed Aug. 5, 1997, disclosed a method of controlling the levelness of the exposed surface by attaching a coating stencil having small apertures, such as a screen or a plate with slots, to the adhesive reservoir, wherein the only outlet for the adhesive material is through the apertures in the coating stencil. The adhesive material is thus forced through the coating stencil. The surface tension between walls of the small apertures and the adhesive material flattens out the exposed surface of the adhesive material. This allows a larger area to be printed with a more uniform thickness layer than if the coating stencil is not used. It is, of course, understood that the flatness or shape of the adhesive material can be controlled by the design of the apertures of the coating stencil. Thus, the invention of the parent application is an efficient way to use the surface tension of the adhesive material to control surface area and depth of the adhesive material available for application to lead fingers. However, the disclosure of the parent application does not explicitly disclose a method of controlling the depth of immersion of the lead fingers into the adhesive material.

The present invention improves upon the disclosure of the parent application by teaching various mechanical methods of controlling the depth of immersion of the lead fingers into the adhesive material pool. As previously discussed, the depth of immersion of the lead fingers into the adhesive material is of critical importance. If the lead fingers extend too deeply into the adhesive material, the lead fingers may break the surface tension of the adhesive material, which will result in the adhesive material wetting the sides and/or bond wire target surfaces of the lead fingers. Of course, if the adhesive material wets the bond wire surface of the lead fingers, it may interfere with a wirebonding step subsequent to LOC attachment of the lead fingers.

To prevent wetting of the bond wire target surfaces of the lead fingers, the present invention employs various mechanisms to control the depth of lead finger immersion. In one embodiment of the present invention, a reservoir (used to form the adhesive material pool) or structures on the reservoir are used to physically limit the depth of immersion of the lead fingers into the adhesive material. In another embodiment of the present invention, the surface of a stencil (through which the adhesive material is extruded) or structures on the stencil are used to physically limit the depth of immersion of the lead fingers into the adhesive material. In yet another embodiment of the present invention, structures which are independent of either the reservoir or the stencil are used to physically limit the depth of immersion of the lead fingers into the adhesive material. In still yet another embodiment of the present invention, structures which are at least partially buoyant in the adhesive material are "floated" on the surface of the adhesive material. The buoyant structures physically limit the depth of immersion of the lead fingers into the adhesive material as the force needed to submerge the buoyant structures in the adhesive material is exceeded by the force applied to push the lead fingers into the adhesive material.

It is, of course, understood that the viscosity and thixotropy of the adhesive material will determine the depth to which the lead fingers should be immersed. Thus, the reservoir and/or the sieve may be designed to present an adhesive material at a specific height, such that the contact with the surface of the sieve or the lead finger stops of the reservoir or sieve applies a requisite amount of adhesive material on the lead fingers. Thus, no additional mechanical or electronic methods are necessary to control the immersion depth of the lead finger.

It is also understood that the present invention can be used to apply viscous materials to any semiconductor element. For example, an adhesive material, conductive or non-conductive, can be applied to the surface of a carrier substrate, such as a printed circuit board, FR4, or the like, for attachment of a semiconductor chip to the carrier substrate, called "direct chip attach" or "DCA", using the method of the present invention.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
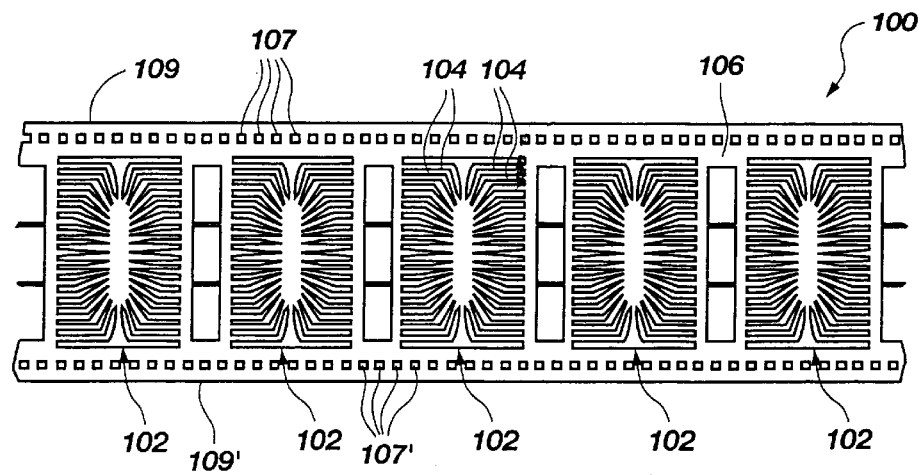
FIG. 1 is a top plan view of an exemplary lead frame ribbon.

FIG. 1 illustrates a portion of an exemplary lead frame ribbon 100. It should be understood that the figures presented in conjunction with this description are not meant to be actual views of any particular portion of an actual semiconductor device or component, but are merely idealized representations which are employed to more clearly and fully depict the process of the invention than would otherwise be possible. Individual lead frames 102, each including a plurality of lead fingers 104, are formed in a long, thin strip of conductive material 106, such as copper, copper alloy, or the like. The lead frames 102 are generally formed by a stamping process or an etching process. The lead frames 102 are formed side-by-side along the conductive material strip 106 wherein the conductive material strip 106 includes a plurality of indexing holes 107, 107' on opposing lengthwise edges 109, 109', respectively, of the conductive material strip 106. The indexing holes 107, 107' are engaged by tooling pins in handling and processing equipment to move the lead frame ribbon 100 and align the lead frames 102 throughout a process of attaching the lead frames 102 to semiconductor dice (not shown) and in subsequent wirebonding and encapsulating operations.

Figure 2:
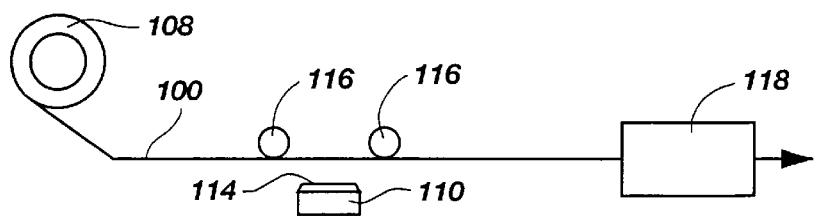
FIGS. 2 and 3 are schematic representations of one process of applying adhesive material to lead fingers according to the present invention.
Figure 3:
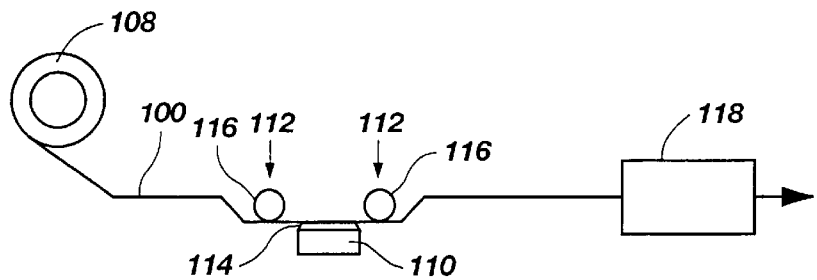

FIGS. 2 and 3 illustrate a schematic of one process of the present invention. Elements common to FIGS. 1, 2, and 3 retain the same numeric designations. The lead frame ribbon 100, such as illustrated in FIG. 1, is fed from a source 108, such as a spool, to an adhesive reservoir 110. As shown in FIG. 3, the lead fingers 104 (not shown) of the lead frame 102 (not shown) are aligned over the adhesive reservoir 110 and the lead frame ribbon 100 is biased downward in direction 112, such as by hydraulic, pneumatic, or electrically-powered biasing mechanisms 116, to contact an adhesive material 114. The adhesive material 114 may be any viscous adhesive material, including, but not limited to, thermoplastics, thermoset resins, flowable pastes, and B-stage adhesive materials. Preferred adhesive materials 114 include cyanate ester, bismaleimide, epoxy, and polyimide.

Figure 4:
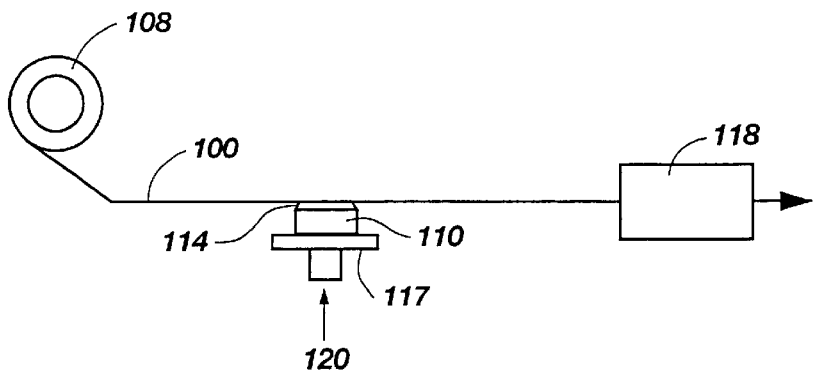
FIG. 4 is a schematic representation of an alternate process of applying adhesive material to lead fingers according to the present invention.

FIG. 4 illustrates a schematic of another process of the present invention which is similar to the process of FIGS. 2 and 3. Elements common to FIGS. 2, 3 and 4 retain the same numeric designations. The only difference between the processes of FIGS. 2 and 3, and FIG. 4 is that the process of FIG. 4 employs an elevator mechanism 117 to move the adhesive reservoir 110 in an upward direction 120 to contact the lead fingers 104 rather than biasing the lead frame ribbon 100 downward to the adhesive reservoir 110.

Figure 5:
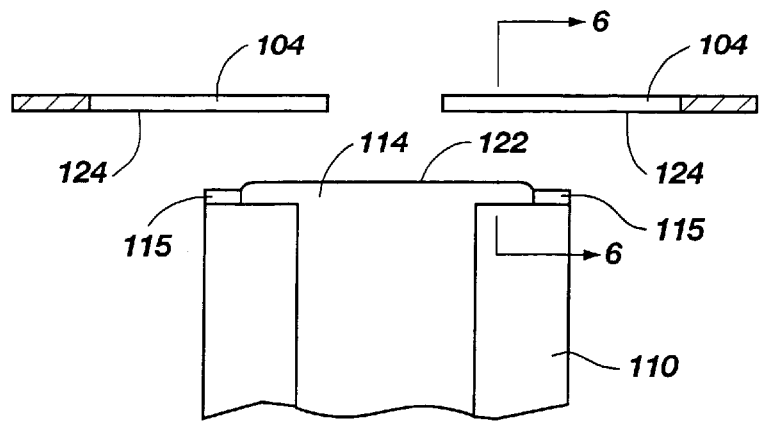
FIGS. 5–10 are side views of a process of contacting lead fingers with an adhesive material according to a method of the present invention.
Figure 6:
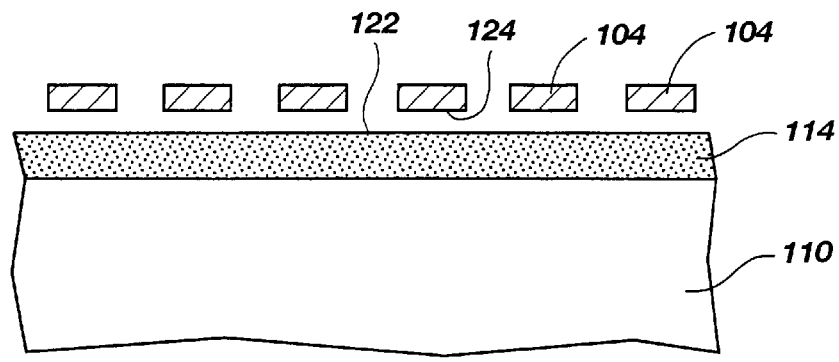

FIGS. 5–10 illustrate cross-sectional views of the lead fingers 104 being brought into contact with the adhesive material 114 and being retracted therefrom. Elements common to FIGS. 2–4 and FIGS. 5–10 retain the same numeric designations. As shown in FIGS. 5 and 6, the lead fingers 104 are positioned over the adhesive reservoir 110. The adhesive reservoir 110 has the adhesive material 114 extending above lead finger stops 115 attached to the adhesive reservoir 110 (shown in FIG. 5). Due to the forces of adhesion and surface tension inherent in the adhesive material 114, an exposed surface 122 of the adhesive material 114 will form a meniscus, or convex-shaped configuration, above the lead finger stops 115. It is, of course, understood that the lead finger stops 115 may simply be the edge portion of the adhesive reservoir 110.

Figure 7:
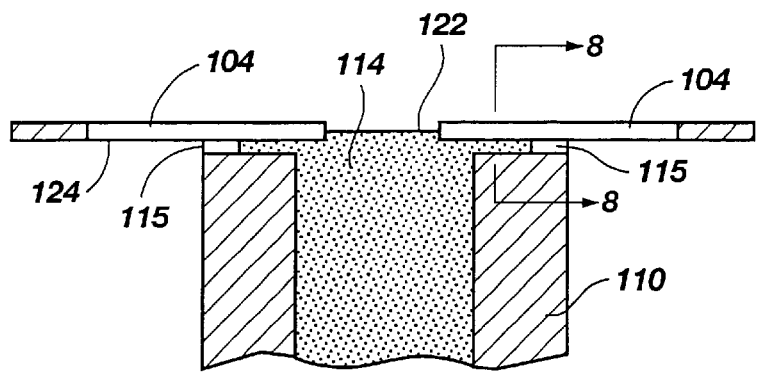
Figure 8:
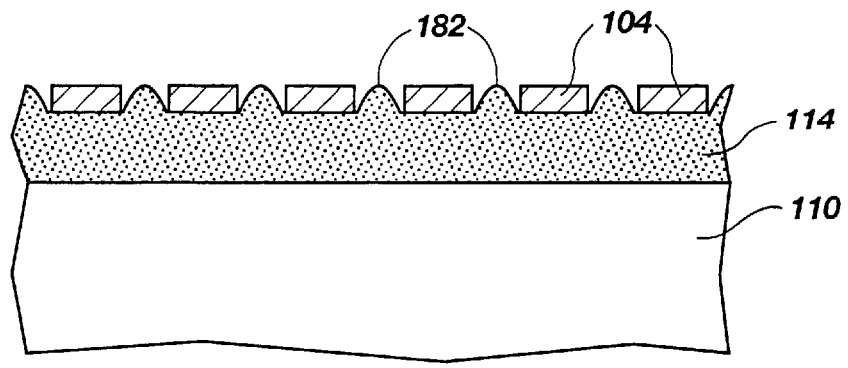
Figure 9:
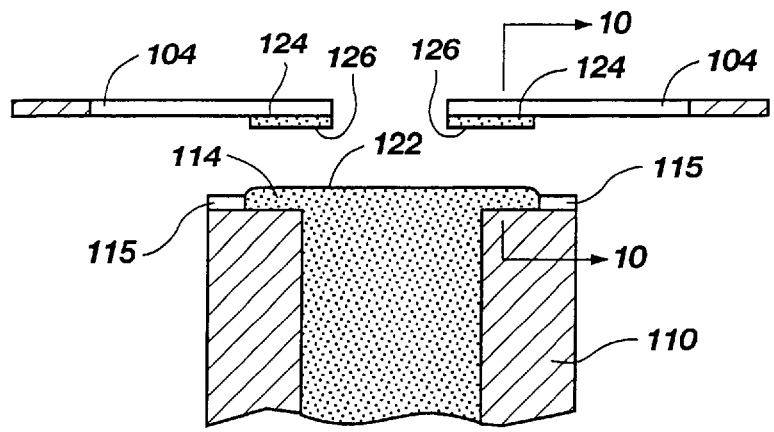
Figure 10:
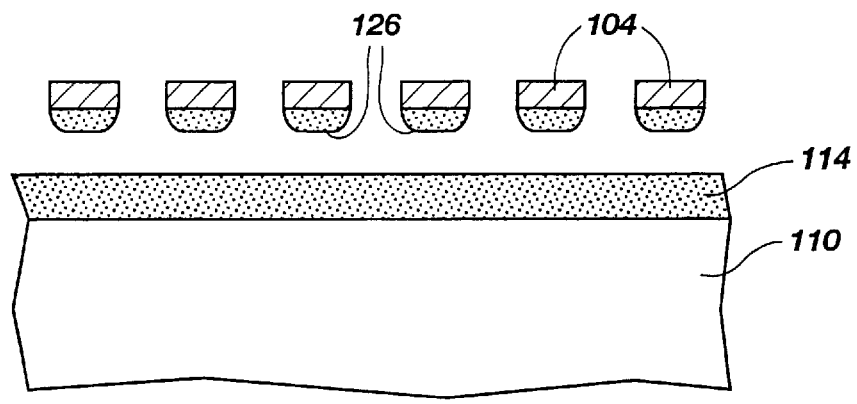

As shown in FIGS. 7 and 8, the lead fingers 104 are lowered onto the exposed surface 122 of the adhesive material 114 to contact the lead finger stops 115. When a bottom surface 124 of the lead fingers 104 comes in contact with the lead finger stop 115, the adhesive material 114 wets out across the bottom surface 124 of the lead fingers 104. The contacting of the lead fingers 104 with the lead finger stops 115 extends the lead fingers 104 past a top surface 182 of the adhesive material exposed surface 122, as shown in FIG. 8. The lead fingers 104 remain in this position for a time sufficient to allow the adhesive material 114 to wet the bottom surface 124 of the lead fingers 104, preferably approximately 10 to 25 milliseconds. As shown in FIGS. 9 and 10, when the lead fingers 104 are retracted from the adhesive material 114, the cohesion of the adhesive material 114 with the lead fingers 104 pulls some of the adhesive material 114 from the bulk of the adhesive material 114 to form an adhesive film 126 on the bottom surface 124 of the lead finger 104. The thickness of the adhesive film 126 on the lead fingers 104 can range from 0.1 to 15 mils depending on the viscosity of the adhesive material 114. Changing the shape of the lead finger 104, changing the rheology of the adhesive material 114, pre-coating the lead finger 104 with a surfactant, such as AMP (2-amino-2-methyl-1-propanol), or placing a solvent in the adhesive material 114 to improve wetting, and/or adding adhesion promoters, such as silane, siloxane, or polyimide siloxane, to the adhesive material 114 will also change the thickness and/or pattern of the adhesive film 126. It is, of course, understood that the adhesive material 114 must be capable of adhering to the lead fingers 104 and should not be of such a low viscosity that it drips when the lead fingers 104 are removed from contact with the exposed surface 122 of the adhesive material 114.

Figure 11:
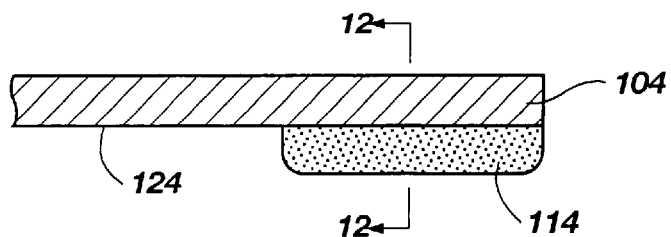
FIG. 11 is a side cross-sectional view of a lead finger after adhesive material attachment according to a method of the present invention.
Figure 12:
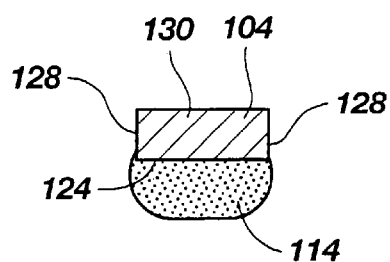
FIG. 12 is a cross-sectional view of a lead finger along line 12—12 of FIG. 11 after adhesive material attachment.

FIG. 11 is a side cross-sectional view of a lead finger 104 after adhesive material 114 application. FIG. 12 is a cross-sectional view of the lead finger 104 of FIG. 11 along line 12—12. As shown in FIGS. 11 and 12, by only extending the lead fingers 104 a predetermined distance into the adhesive material 114 without breaking the surface tension of the adhesive material 114, the adhesive material 114 will not wet sides 128 of the lead finger 104 and, of course, will not collect on a bond wire surface 130 of the lead finger 104 (the bond wire surface 130 is the lead finger surface where a bond wire is subsequently attached during further processing). Since the adhesive material 114 does not collect on the bond wire surface 130, there will be no adhesive material 114 to interfere with a wirebonding step subsequent to LOC attachment of the lead fingers 104 to an active surface of a semiconductor die.

Referring back to FIG. 5, the adhesive reservoir 110 can be shaped such that the exposed surface 122 of the adhesive material 114 is in a precise location and configuration. When the lead fingers 104 contact the exposed surface 122 of the adhesive material 114, the adhesive material 114 attaches to only specific, desired portions of the lead fingers 104.

Figure 13:
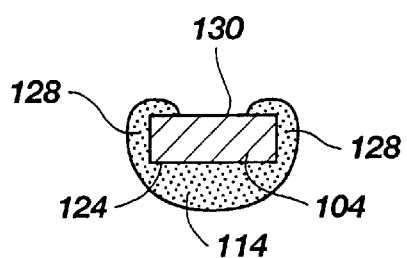
FIG. 13 is a cross-sectional view of a lead finger after adhesive material attachment, wherein the adhesive material exhibits excessive wetting of the lead finger.

It is very important that the exposed surface 122 be as level as possible. If the exposed surface 122 is not level, portions of the lead fingers 104 may extend too deeply into the adhesive material 114. When this occurs, the adhesive material 114 may wet the lead finger sides 128 and may even wet the lead finger bond wire surface 130, as shown in FIG. 13. If the adhesive material 114 wets the bond wire surface 130, the adhesive material 114 may interfere with a wirebonding step subsequent to LOC attachment of the lead fingers 104 to an active surface of a semiconductor die, as mentioned above.

Figure 14:
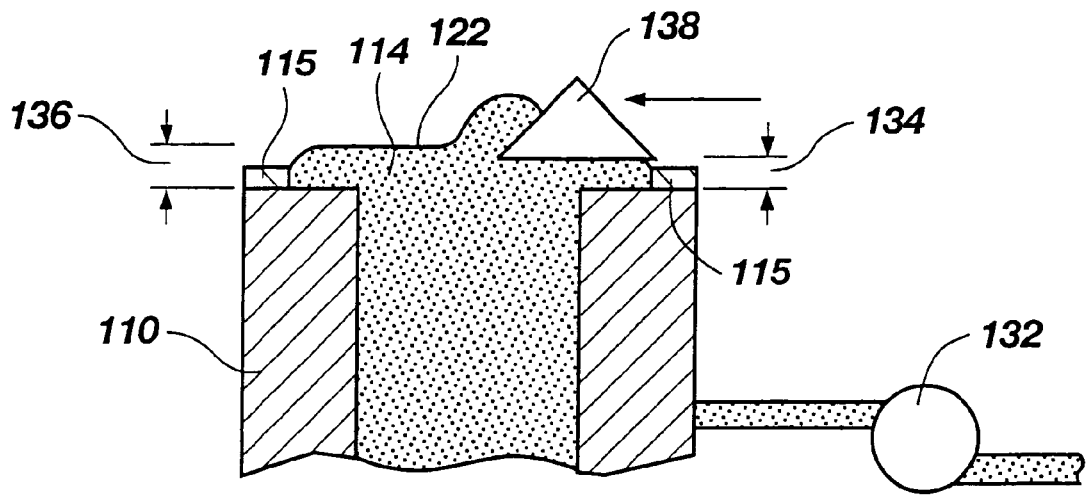
FIG. 14 is a schematic representation of a mechanical mechanism for maintaining the height of an exposed surface of an adhesive material.

Numerous techniques may be used to keep the exposed surface 122 of the adhesive material 114 level. It is, of course, understood that exposed surface 122 extends upwardly from the adhesive reservoir 110 due to a slight excess of adhesive material 114 within the adhesive reservoir 110. As shown in FIG. 14, the adhesive material 114 is pumped to the adhesive reservoir 110 from an adhesive material source (not shown) by a pump 132. A desired exposed surface height 134 of exposed surface 122 can be achieved by feeding an excess of adhesive material 114 into the adhesive reservoir 110 such that an initial exposed surface height 136 is higher than the desired exposed surface height 134. A metering mechanism, such as wiper 138, can be utilized to meter the adhesive material 114 from the initial exposed surface height 136 to the desired exposed surface height 134.

Moreover, a desired exposed surface height 134 of exposed surface 122 can be achieved by feeding an excess of adhesive material 114 into the adhesive reservoir 110 such that an initial exposed surface height 136 is higher than the desired exposed surface height 134. The adhesive material 114 is then drawn back (e.g., by vacuum), which results in a flattening of the exposed surface 122.

Figure 15:
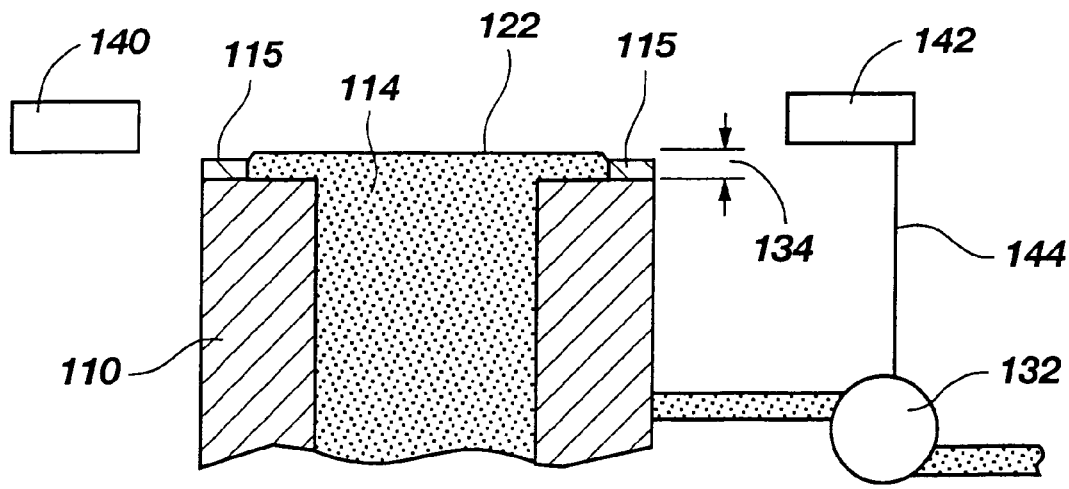
FIG. 15 is a schematic representation of a height detection and control loop for maintaining the height of an exposed surface of an adhesive material.

Furthermore, a variety of feed back and feed forward control schemes may be used to control the desired exposed surface height 134 of the exposed surface 122. One such control scheme is shown in FIG. 15. Elements common to FIG. 14 and FIG. 15 retain the same numeric designations. A height detection mechanism, shown as a light (preferably a laser) transmitter 140 and a light receiver 142, is used to determine the height of the exposed surface 122. The control signal 144 triggers the pump 132 to stop or a valve (not shown) to shut when the desired exposed surface height 134 is achieved.

Figure 16:
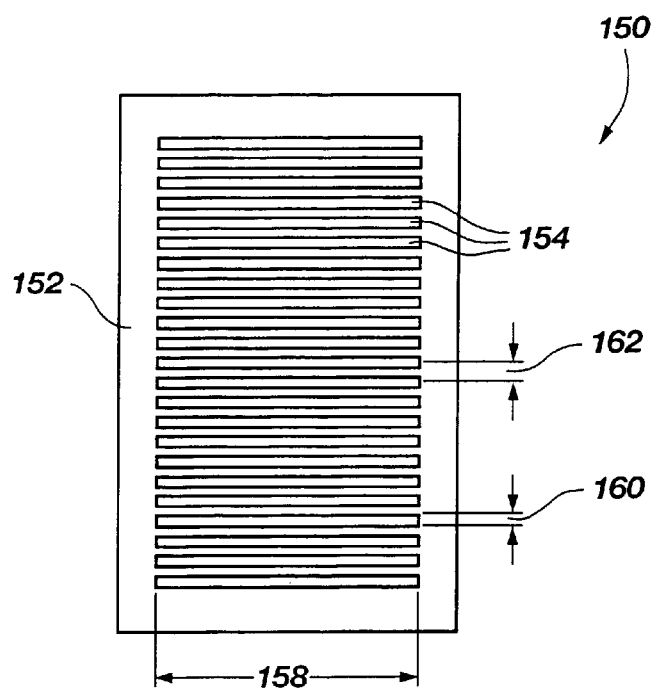
FIG. 16 is a plan view of a coating stencil according to the present invention.
Figure 17:
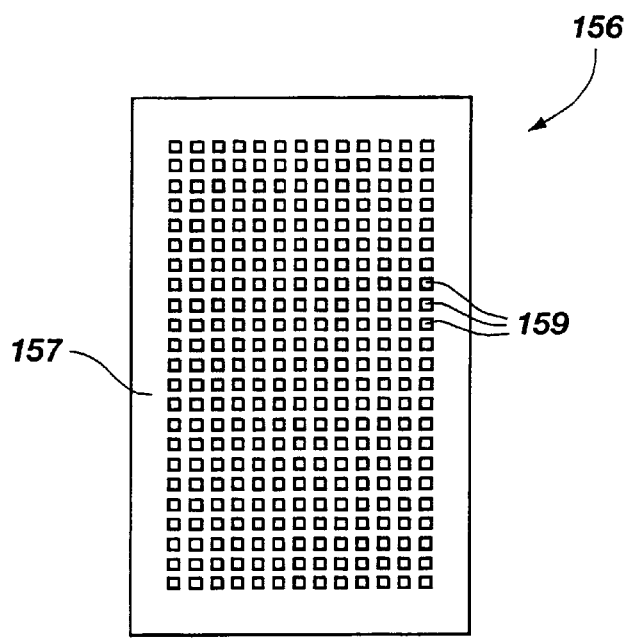
FIG. 17 is a plan view of an alternate coating stencil according to the present invention.

A preferred method of controlling the levelness of the exposed surface 122 is by forcing or extruding the adhesive material 114 through a coating stencil having small apertures, such as a screen or a plate with slots. Such a coating stencil 150 is shown in FIG. 16. The coating stencil 150 is a flat plate 152 having a plurality of slots 154 therethrough. The coating stencil 150 shown has twenty-three parallel slots 154 approximately 0.260 inches in length 158 and approximately 0.010 inches in width 160, with the slots 154 being on a parallel centerline pitch 162 of approximately 0.020 inch from one another. An alternate coating stencil 156 is shown in FIG. 17. The coating stencil 156 is essentially a screen comprising a flat plate 157 having a plurality of square or rectangular apertures 159. It is, of course, understood that the apertures may be of any size (depending on the viscosity of the adhesive material) and any shape, including triangles, rectangles, squares, circles, ovals, or the like.

Figure 18:
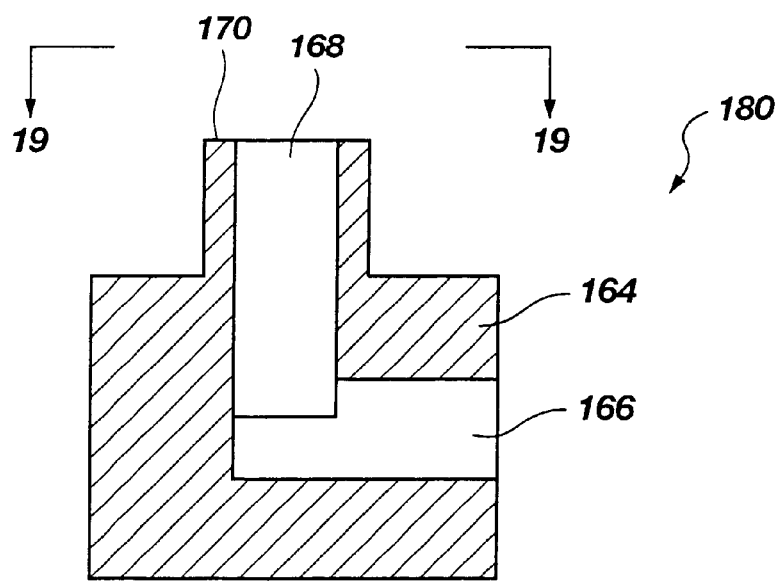
FIG. 18 is a side cross-sectional view of an adhesive reservoir according to the present invention.
Figure 19:
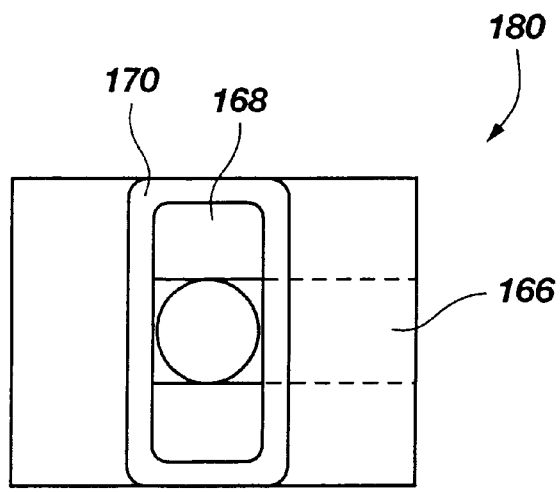
FIG. 19 is a top plan view of the adhesive reservoir of the present invention shown in FIG. 18 along line 19—19.

The coating stencil 150 is attached to an adhesive reservoir 180. The exemplary adhesive reservoir 180, shown in FIGS. 18 and 19 without the coating stencil attached, comprises a housing 164 having an adhesive inflow chamber 166 in fluid communication with a pool chamber 168. The coating stencil 150 is attached proximate an upper surface 170 of the pool chamber 168, such that the only upward outlet for the adhesive material is through the apertures in the coating stencil. It is, of course, understood that the adhesive reservoir 180 may include an adhesive circulation mechanism to circulate the adhesive material to maintain the uniformity thereof The cohesion between the aperture (slot) walls (not shown) and the adhesive material 114 flattens out the exposed surface 122 of the adhesive material 114. This allows a larger area to be printed with a more uniform thickness of the adhesive material 114 than if the coating stencil 150 is not used. Put another way, the cohesion between the aperture walls and the adhesive material 114 basically pulls the adhesive material 114 down to the screen surface, which counteracts the force caused by the surface tension of the adhesive material 114. As a result, the adhesive material 114 is pulled to the coating stencil 150, thus flattening out. The mathematical relationship for the phenomena is $\Delta p = 2\gamma/R$ where $\Delta p$ is the difference between the pressure within the adhesive material and the ambient air, $\gamma$ is the surface tension of the adhesive material, and R is the radius of curvature when the adhesive material is extruded through the apertures in the coating stencil. R will be about the same for all openings, since $\Delta p$ and $\gamma$ are generally constant for most operations. Since the apertures are small, the extruded material is "flat" with about the same R.

Figure 20:
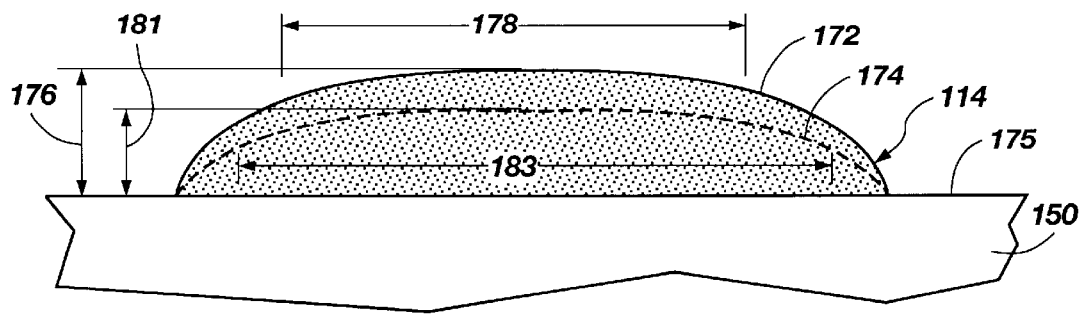
FIG. 20 is a side plan view of stenciled and non-stenciled adhesive material profiles.

An example of the difference between a non-stenciled adhesive material exposed surface 172 and stenciled adhesive material exposed surface 174 is shown in FIG. 20. For this example, the adhesive material 114 was Ablestik XR-041395-9™ Polyimide LOC Adhesive (Ablestik Laboratories, Rancho Dominguez, Calif.) and the coating stencil 150 was as described above for FIG. 16. Ablestik XR-041395-9™ has a viscosity of 62,000 cps at 25° C. and a thixotropic index of 3.5. It is, of course, understood that the width, length, pitch and shape of the apertures in the coating stencil will vary for different viscosities of adhesive materials. A rule of thumb for determination of aperture size is that for every viscosity increase of 25%, the aperture size should decrease by 50%.

The illustration in FIG. 20 is an AutoCad™ program rendering of a digitized measurement of the non-stenciled adhesive material exposed surface 172 and stenciled adhesive material exposed surface 174. The maximum height 176 of the non-stenciled adhesive material exposed surface 172 was approximately 0.07 inches above an upper surface 175 of the coating stencil 150 and the effective adhesion surface 178 of the non-stenciled adhesive material exposed surface 172 was approximately 0.26 inches wide. The maximum height 181 of the stenciled adhesive material exposed surface 174 was approximately 0.05 inches and the effective adhesion surface 183 of the stenciled adhesive material exposed surface 174 was approximately 0.33 inches wide. Thus, the use of a coating stencil 150 resulted in an increase of effective adhesion surface of about 21.2%. The effective adhesion surfaces 178, 183 are determined as the area from the maximum height 176, 181 of the adhesive material exposed surfaces 172, 174 to a position about 5 mils below the maximum height 176, 181.

Figure 21:
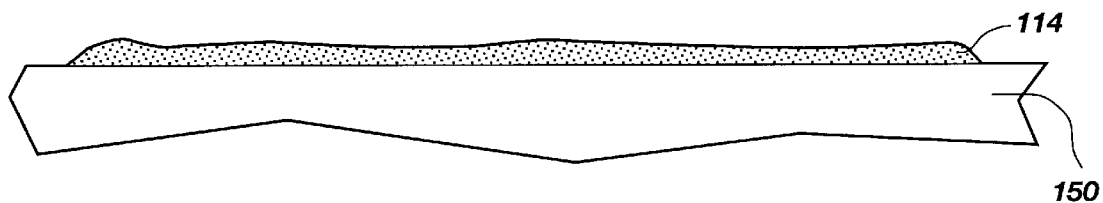
FIG. 21 is a side plan view of a stenciled adhesive material profile after the induction of a vacuum.

It has also been found that an even more uniform profile for the exposed surface can be achieved by inducing a slight vacuum on a bottom side of the coating stencil 150 by any known technique. FIG. 21 illustrates such a profile using the same adhesive material 114 and coating stencil 150 described in FIG. 20, wherein a vacuum of between about 2 and 3 inches of $H_2O$ is applied. The vacuum method provided a very uniform coating at between about 0.02 to 0.03 inches in adhesive material height.

Figure 22:
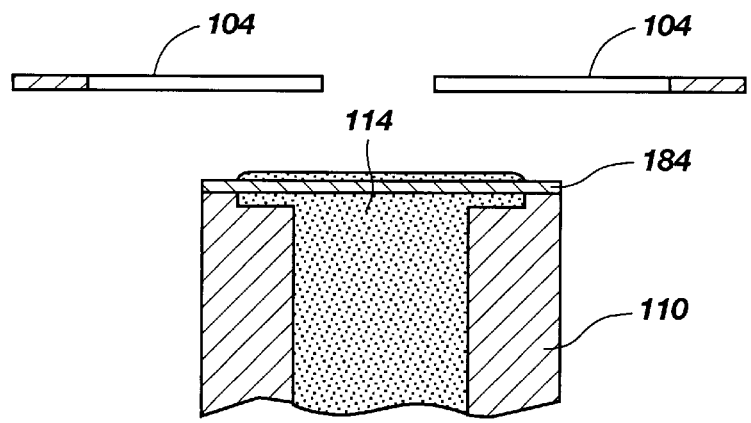
FIGS. 22–24 are side cross-sectional views of a technique of forming an adhesive film on lead fingers using a coating stencil according to the present invention.
Figure 23:
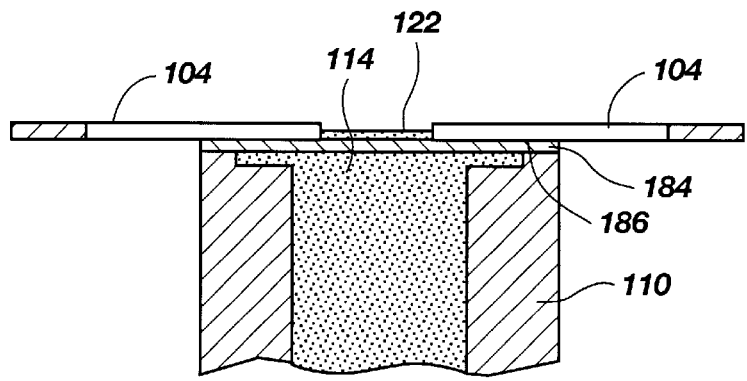
Figure 24:
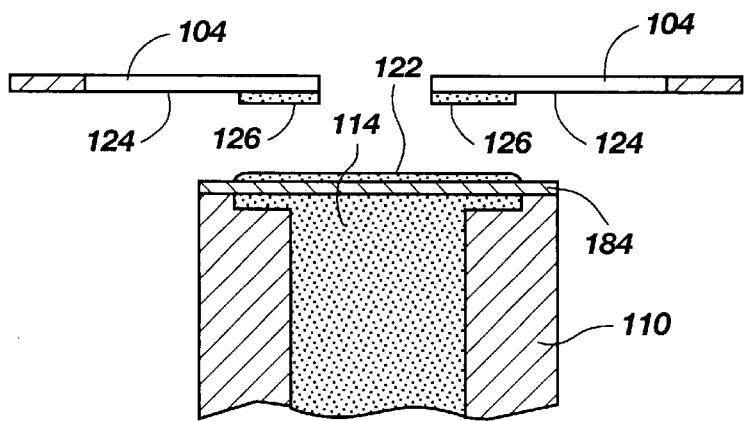

FIGS. 22–24 illustrate cross-sectional views of the lead fingers 104 being brought into contact with the adhesive material 114 on a coating stencil 184 and being retracted therefrom. Elements common to FIGS. 5–10 and FIGS. 22–24 retain the same numeric designations. As shown in FIG. 22, the lead fingers 104 are positioned over the adhesive reservoir 110. The adhesive reservoir 110 has the adhesive material 114 extending through the apertures (not shown) in the coating stencil 184, such as the coating stencil 150 illustrated in FIG. 16 and the coating stencil 156 illustrated in FIG. 17.

As shown in FIG. 23, the lead fingers 104 are lowered into the exposed surface 122 of the adhesive material 114 to an upper surface 186 of the coating stencil 184. When the bottom surface 124 of the lead fingers 104 comes in contact with the coating stencil upper surface 186, the adhesive material 114 wets out across the bottom surface 124 of the lead fingers 104. As shown in FIG. 24, when the lead fingers 104 are retracted from the adhesive material 114, the cohesion of the adhesive material 114 with the lead fingers 104 pulls some of the adhesive material 114 from the bulk of the adhesive material 114 to form an adhesive film 126 on the bottom surface 124 of the lead finger 104.

Figure 25:
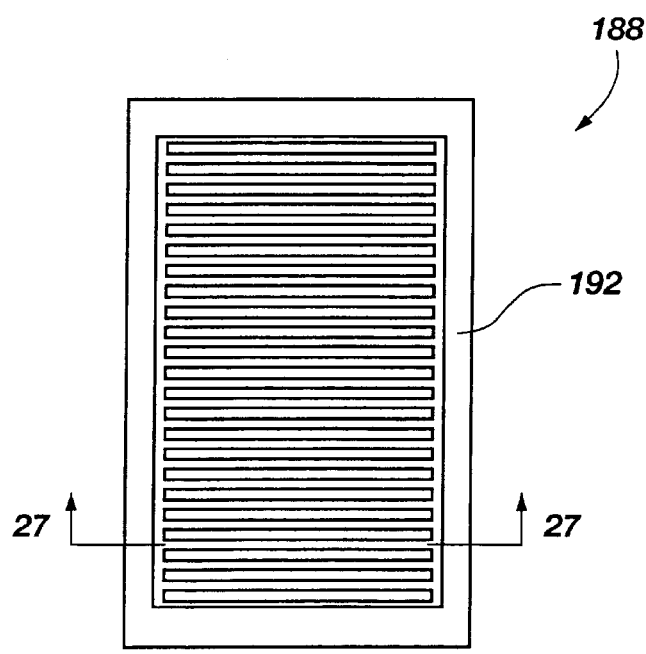
FIG. 25 is a plan view of a coating stencil having lead finger stops according to the present invention.
Figure 26:
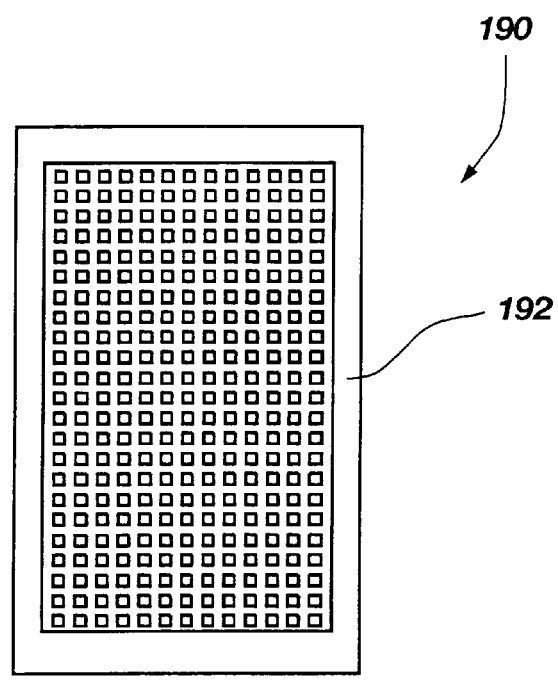
FIG. 26 is a plan view of an alternate coating stencil having lead finger stops according to the present invention.
Figure 27:
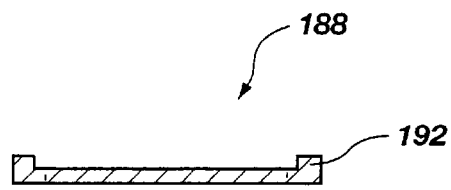
FIG. 27 is a side cross-sectional view of the coating stencil illustrated in FIG. 25 along line 27—27 according to the present invention.
Figure 28:
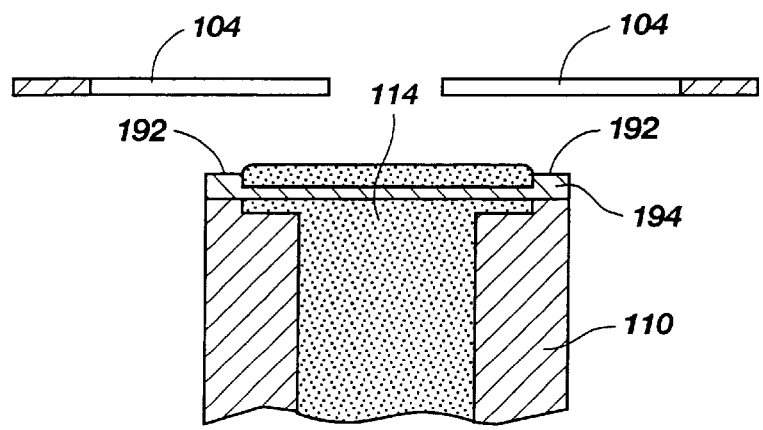
FIGS. 28–30 are side cross-sectional views of a technique of forming an adhesive film on lead fingers using a coating stencil having lead finger stops according to the present invention.
Figure 29:
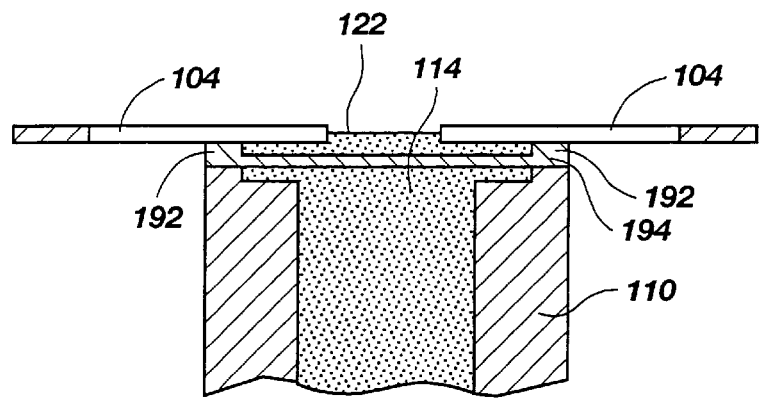
Figure 30:
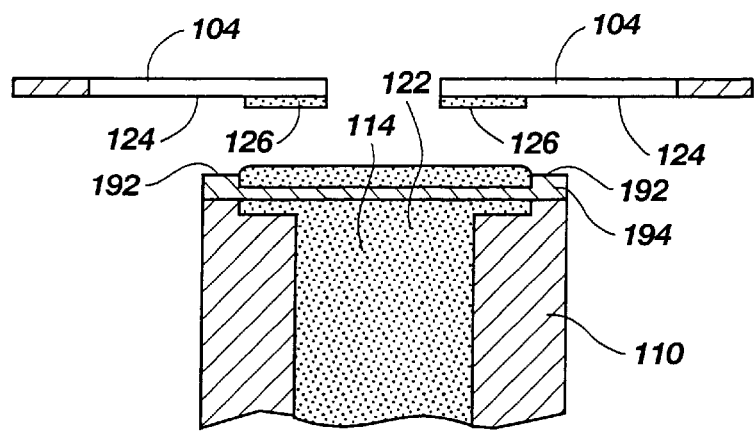

FIGS. 25 and 26 illustrate coating stencils 188 and 190, respectively, which each have a lead finger stop 192 about a periphery of each coating stencil. FIG. 27 illustrates a cross-sectional view of the coating stencil 188 along lines 27—27 of FIG. 25. FIGS. 28–30 illustrate cross-sectional views of the lead fingers 104 being brought into contact with the adhesive material 114 on a coating stencil 194, such as illustrated in FIGS. 25 and 26, and being retracted therefrom. Elements common to FIGS. 5–10 and 25–27, and FIGS. 28–30 retain the same numeric designations. As shown in FIG. 28, the lead fingers 104 are positioned over the adhesive reservoir 110. The adhesive reservoir 110 has the adhesive material 114 extending through apertures (not shown) in a coating stencil 194, such as the coating stencil 188 illustrated in FIG. 25 and the coating stencil 190 illustrated in FIG. 26.

As shown in FIG. 29, the lead fingers 104 are lowered into the exposed surface 122 of the adhesive material 114 to a lead finger stop 192 on the coating stencil 194. When the bottom surface 124 of the lead fingers 104 comes in contact with the lead finger stop 192, the adhesive material 114 wets out across the bottom surface 124 of the lead fingers 104. As shown in FIG. 30, when the lead fingers 104 are retracted from the adhesive material 114, the cohesion of the adhesive material 114 with the lead fingers 104 pulls some of the adhesive material 114 from the bulk of the adhesive material 114 to form an adhesive film 126 on the bottom surface 124 of the lead finger 104.

Figure 31:
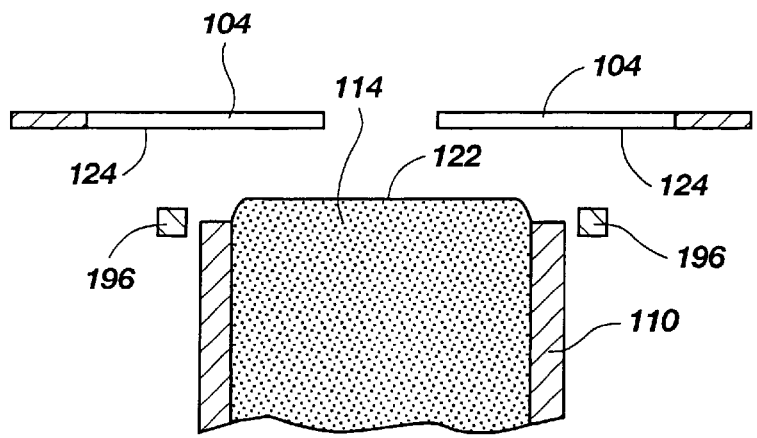
FIGS. 31–33 are side cross-sectional views of a technique of forming an adhesive film on lead fingers using lead finger stop structures which are independent of the reservoir and/or coating stencil according to the present invention.
Figure 32:
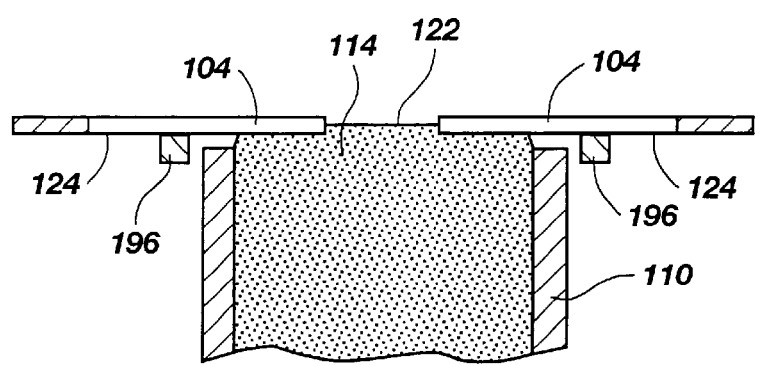
Figure 33:
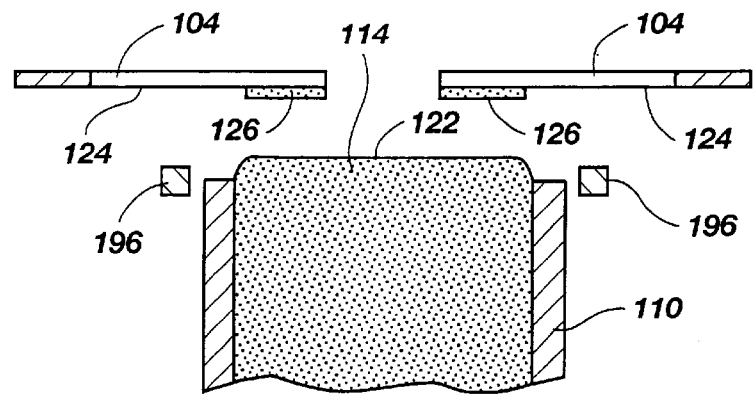

FIGS. 31–33 illustrate cross-sectional views of an alternative apparatus having lead finger stop structures 196, such as bars, beams, or the like, which are independent of either the reservoir or the coating stencil and which are used to physically limit the depth of immersion of the lead fingers into the adhesive material. Preferably, the structures 196 can be adjusted vertically to a desired height. FIGS. 31–33 illustrate the lead fingers 104 being brought into contact with the adhesive material 114 in the adhesive reservoir 110 and being retracted therefrom. Elements common to FIGS. 5–10 and FIGS. 31–33 retain the same numeric designations. As shown in FIG. 31, the lead fingers 104 are positioned over the adhesive reservoir 110. The adhesive reservoir 110 has the adhesive material 114 extending thereabove.

As shown in FIG. 32, the lead fingers 104 are lowered into the exposed surface 122 of the adhesive material 114 to stop on the lead finger stop structures 196. When the bottom surface 124 of the lead fingers 104 comes in contact with the adhesive material 114, the adhesive material 114 wets out across the bottom surface 124 of the lead fingers 104. As shown in FIG. 33, when the lead fingers 104 are retracted from the adhesive material 114, the cohesion of the adhesive material 114 with the lead fingers 104 pulls some of the adhesive material 114 from the bulk of the adhesive material 114 to form an adhesive film 126 on the bottom surface 124 of the lead finger 104.

Figure 34:
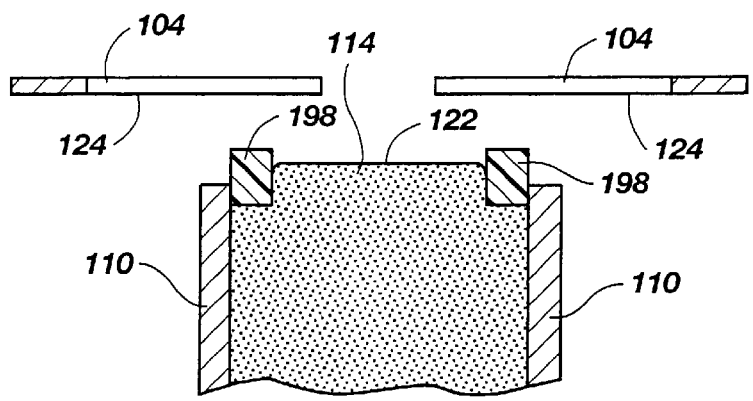
FIGS. 34–36 are side cross-sectional views of a technique of forming an adhesive film on lead fingers using buoyant lead finger stop structures according to the present invention.
Figure 35:
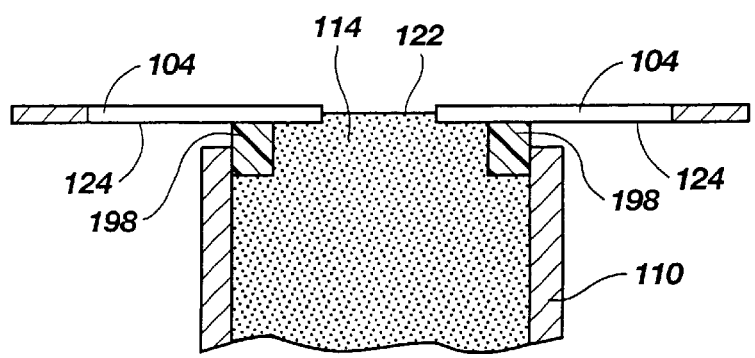
Figure 36:
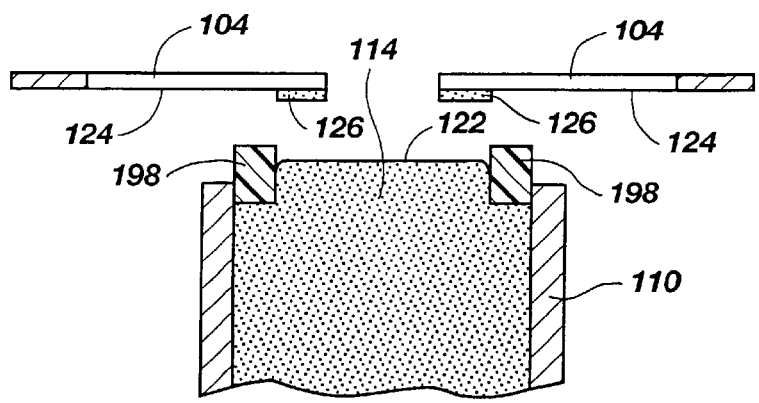

FIGS. 34–36 illustrate cross-sectional views of an alternative apparatus having buoyant lead finger stop structures 198, which are independent of the reservoir 110 and which are used to physically limit the depth of immersion of the lead fingers 104 into the adhesive material 114. FIGS. 34–36 illustrate the lead fingers 104 being brought into contact with the adhesive material 114 in the adhesive reservoir 110 and being retracted therefrom. Elements common to FIGS. 5–10 and FIGS. 34–36 retain the same numeric designations. As shown in FIG. 34, the lead fingers 104 are positioned over the adhesive reservoir 110. The adhesive reservoir 110 has the adhesive material 114 extending thereabove and the buoyant lead finger stop structures 198 "floating" in the adhesive material 114.

As shown in FIG. 35, the lead fingers 104 are lowered into the exposed surface 122 of the adhesive material 114 to contact the buoyant lead finger stop structures 198. As the lead fingers 104 press down on the buoyant lead finger stop structures 198, the buoyant lead finger stop structures 198 begin to move downward into the adhesive material 114. As the adhesive material 114 is displaced by the buoyant lead finger stop structure 198, the adhesive material 114 moves upward toward the lead fingers 104.

An advantage of the buoyant lead finger stop structures 198 embodiment is that the need for a highly accurate adhesive material control system is eliminated, because the amount of adhesive material 114 (of a specific density and viscosity) displaced by a specific buoyant lead finger stop structure 198 for a given force applied to the lead fingers 104 can be determined and will be substantially constant. In other words, for a given force on the lead fingers on a specific buoyant lead finger stop structure 198, the level of the specific adhesive material 114 will always rise to substantially the same position, so long as sufficient adhesive material resides in the adhesive reservoir 110.

When the bottom surface 124 of the lead fingers 104 comes in contact with the adhesive material 114, the adhesive material 114 wets out across the bottom surface 124 of the lead fingers 104. Preferably, a mechanism (not shown) controlling the downward motion of the lead fingers 104 will be connected to a pressure sensor (not shown) which will trigger the mechanism to stop when a predetermined pressure is attained. As shown in FIG. 36, when the lead fingers 104 are retracted from the adhesive material 114, the cohesion of the adhesive material 114 with the lead fingers 104 pulls some of the adhesive material 114 from the bulk of the adhesive material 114 to form an adhesive film 126 on the bottom surface 124 of the lead finger 104.

Figure 37:
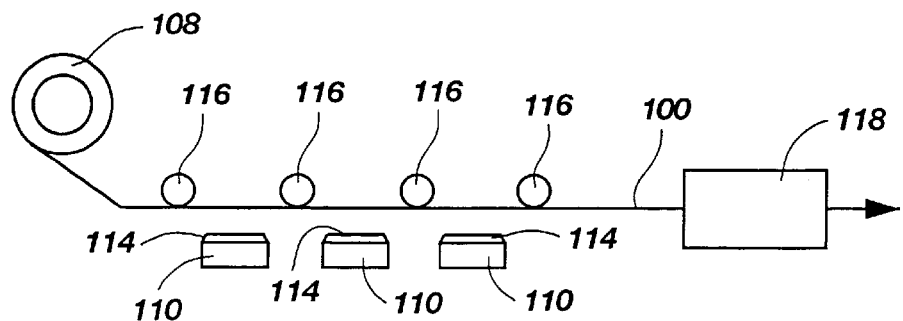
FIG. 37 is a schematic representation of another multiple adhesive material attachment process of the present invention.

It is also understood that multiple reservoirs 110 could be configured as shown in FIG. 37. With such a configuration, the adhesive material 114 can be applied to the lead fingers 104 of multiple lead frames 102 simultaneously.

Once the adhesive material 114 has been applied to the lead fingers 104, the lead frame ribbon 100 may, optionally, be fed to a curing oven 118, shown in FIGS. 2, 3, 4, and 37, to set the adhesive material 114. A semiconductor die (not shown) then can be attached to a lead frame 102 and adhesive film 126 by known LOC attach methods.

Figure 38:
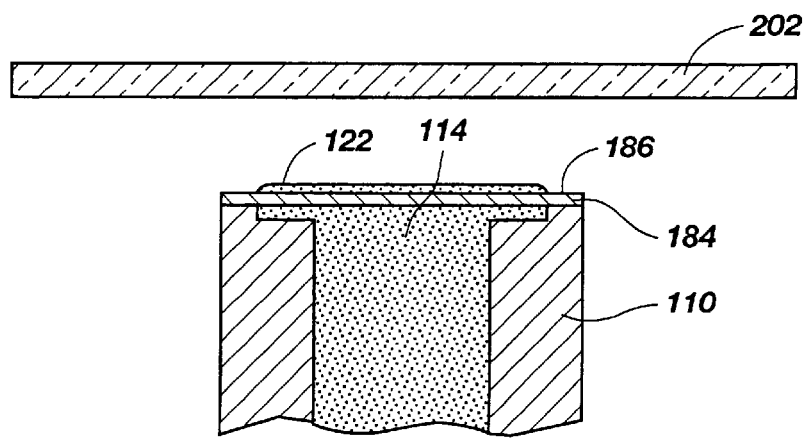
FIGS. 38–40 are side cross-sectional views of a technique of forming an adhesive film on a carrier substrate using a coating stencil according to the present invention.

It is also understood that the present invention can be used to apply viscous materials to any semiconductor element. FIGS. 38–41 illustrate an exemplary alternate embodiment of the present invention wherein a carrier substrate 202 is brought into contact with the adhesive material 114 on a coating stencil 184 and is retracted therefrom. Elements common to FIGS. 22–24 and FIGS. 38–41 retain the same numeric designations. As shown in FIG. 38, the carrier substrate 202 is positioned over the adhesive reservoir 110. The adhesive reservoir 110 has the adhesive material 114 extending through the apertures (not shown) in the coating stencil 184, such as the coating stencil 150 illustrated in FIG. 16 and the coating stencil 156 illustrated in FIG. 17.

Figure 39:
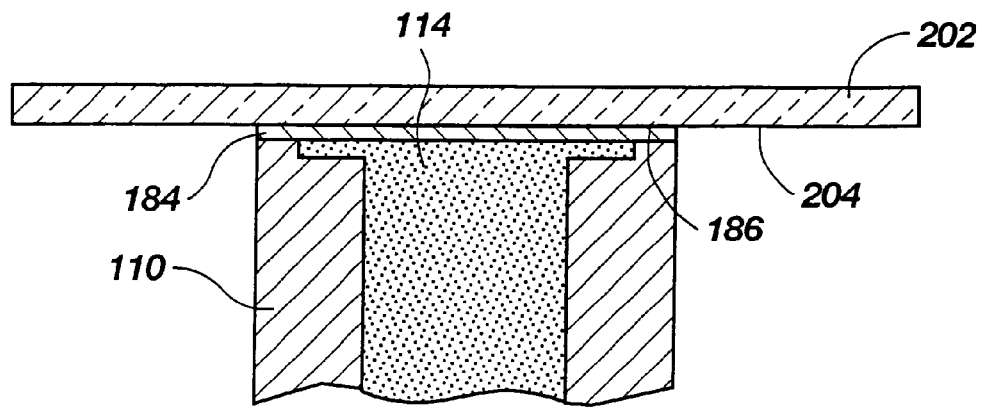
Figure 40:
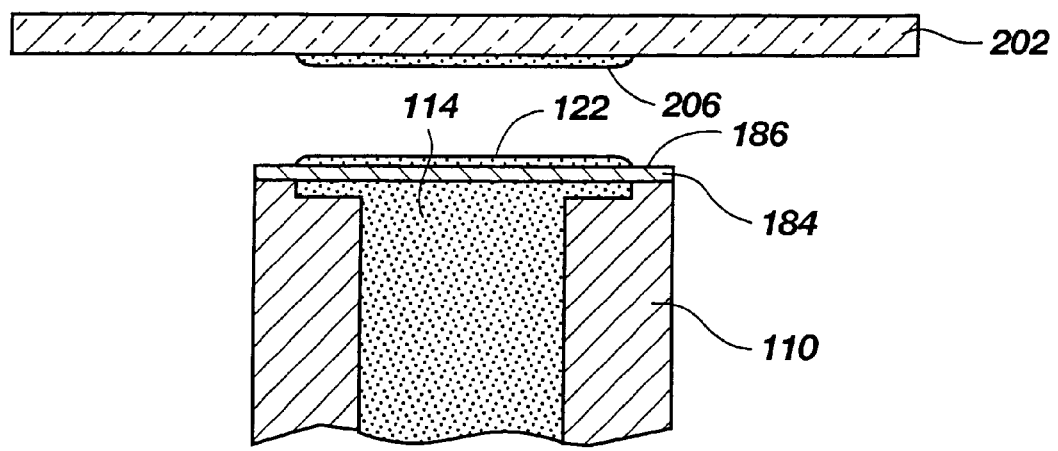

As shown in FIG. 39, the carrier substrate 202 is lowered into the exposed surface 122 (shown in FIG. 38) of the adhesive material 114 to an upper surface 186 of the coating stencil 184. When the bottom surface 204 of the carrier substrate 202 comes in contact with the coating stencil upper surface 186, the adhesive material 114 wets out across the bottom surface 204 of the carrier substrate 202. As shown in FIG. 40, when the carrier substrate 202 is retracted from the adhesive material 114, the cohesion of the adhesive material 114 with the carrier substrate 202 pulls some of the adhesive material 114 from the bulk of the adhesive material 114 to form an adhesive film 206 on the bottom surface 204 of the carrier substrate 202.

Figure 41:
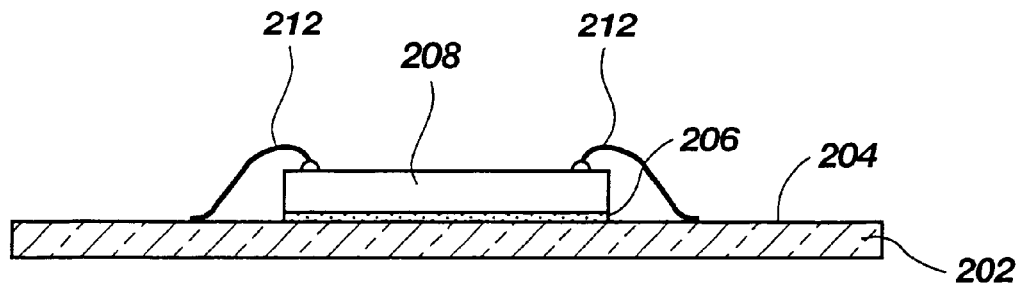
FIG. 41 is a side cross-sectional view of a semiconductor chip attached to a carrier substrate having an adhesive film applied thereon by a method according to the present invention.

As shown in FIG. 41, the carrier substrate 202 can be inverted and a semiconductor chip 208 may be adhered to the carrier substrate 202 with the adhesive film 206. The semiconductor chip 208 can make an electrical connection with the carrier substrate 202 utilizing any known electrical connector 212, such as bond wires (shown) or TAB connectors. It is, of course, understood that the semiconductor chip 208 can be coated in the adhesive material by a method of the present invention and attached to the carrier substrate 202.

Figure 42:
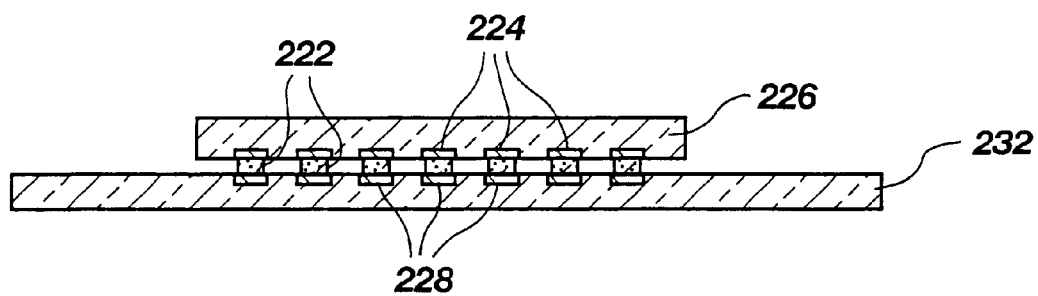
FIG. 42 is a side cross-sectional view of a semiconductor chip attached and in electrical communication with a carrier substrate through a conductive adhesive film applied thereon by a method according to the present invention.
Figure 43:
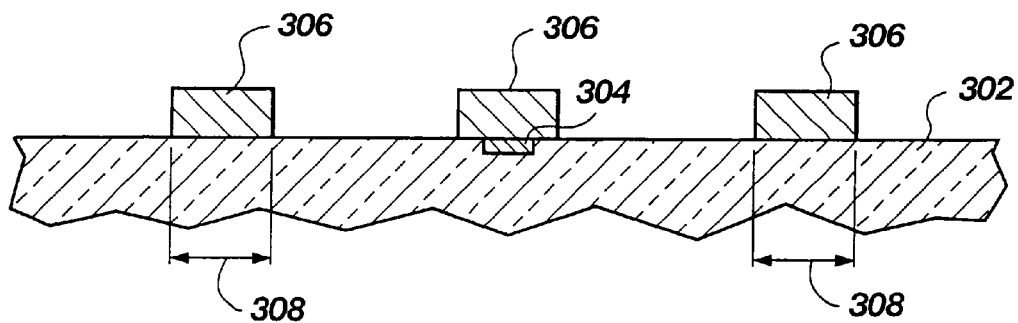
FIGS. 43–49 are side cross-sectional views of a prior art technique of forming adhesive areas on a substrate for LOC attachment.
Figure 44:
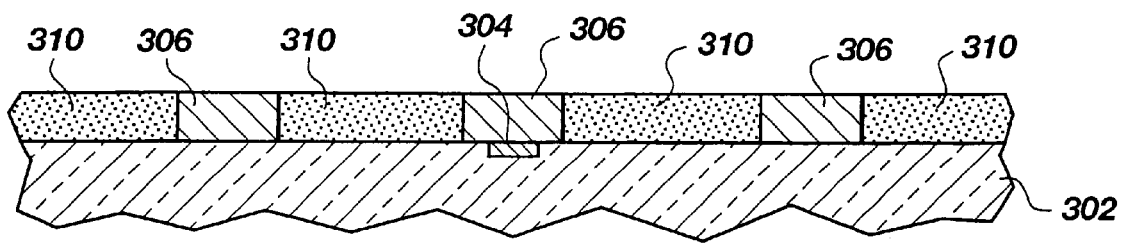
Figure 45:
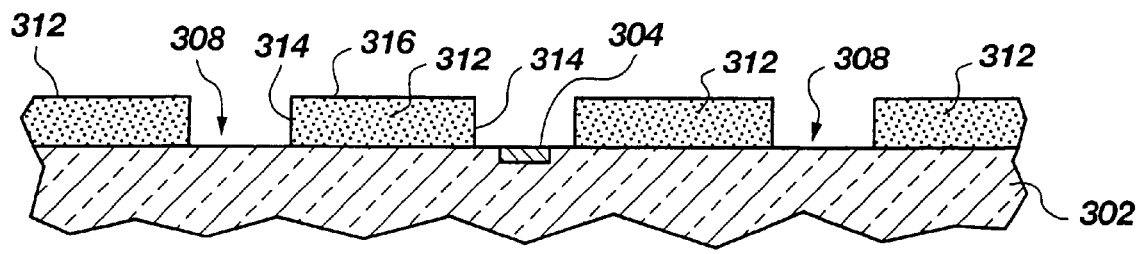
Figure 46:
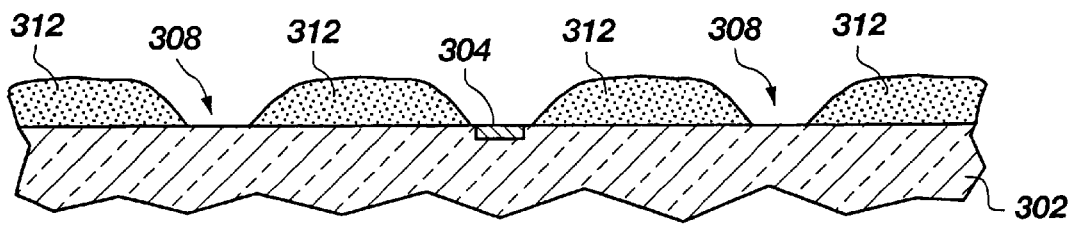
Figure 47:
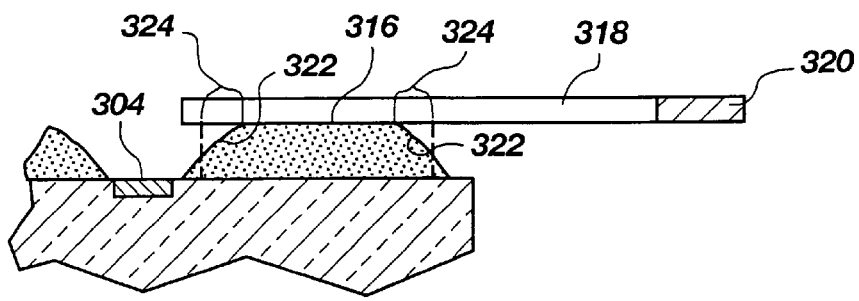
Figure 48:
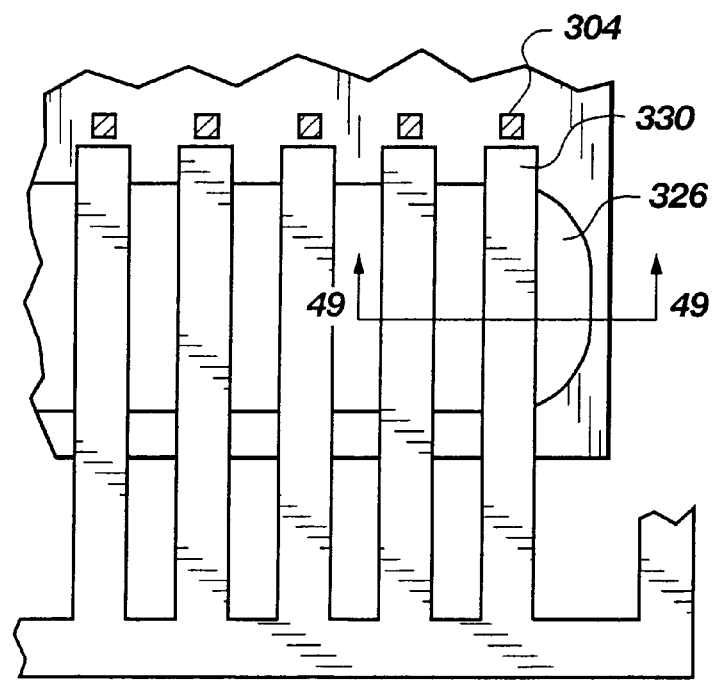
Figure 49:
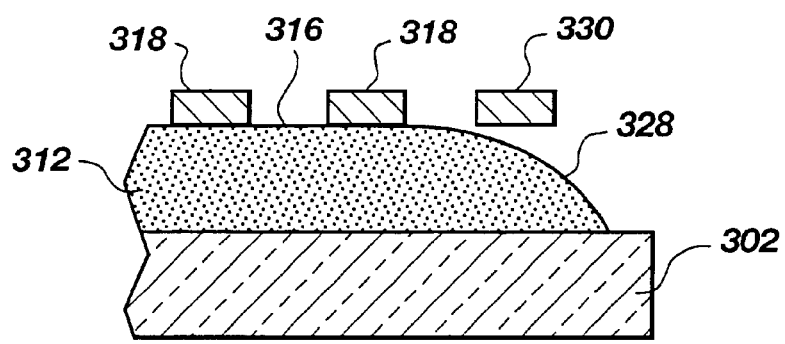
Figure 50:
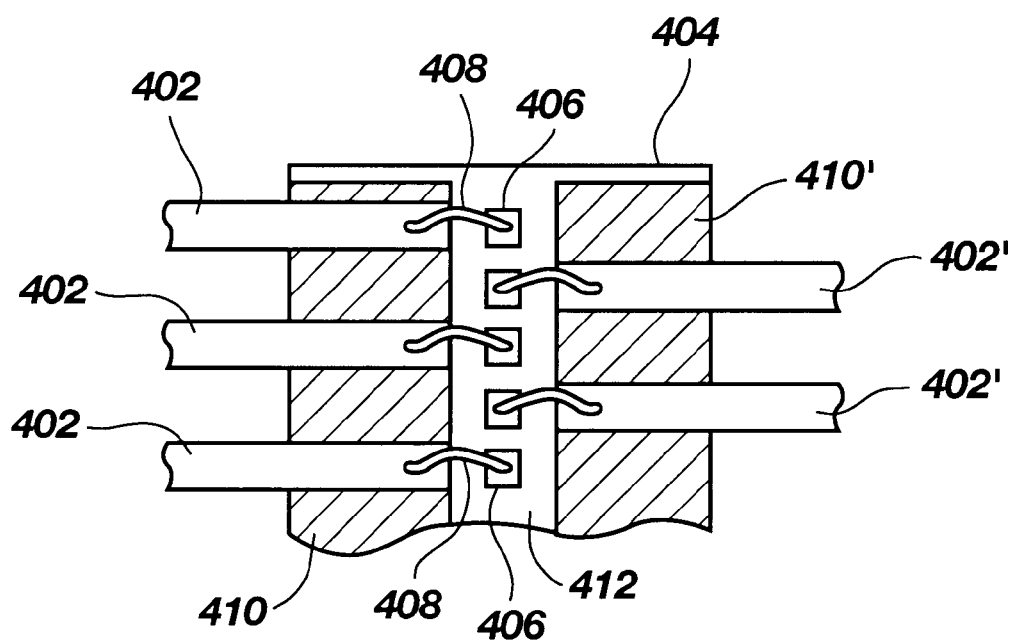
FIG. 50 is a top view of a prior art technique of LOC attachment using adhesive tape.
Figure 51:
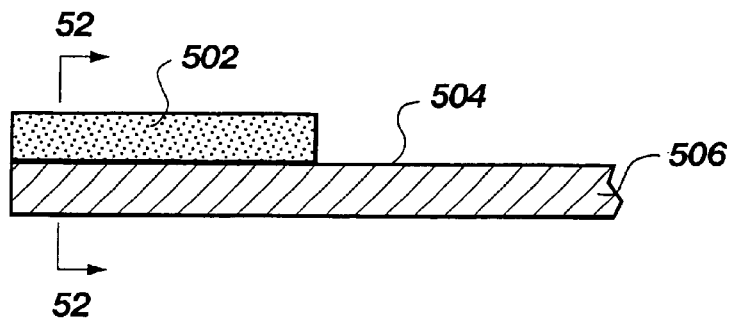
FIGS. 51–53 are side cross-sectional views of a prior art technique of forming adhesive areas on lead fingers for LOC attachment.
Figure 52:
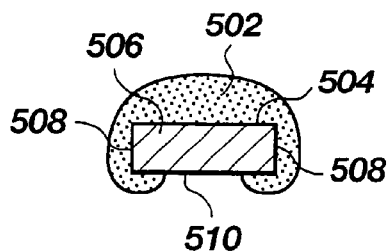
Figure 53:
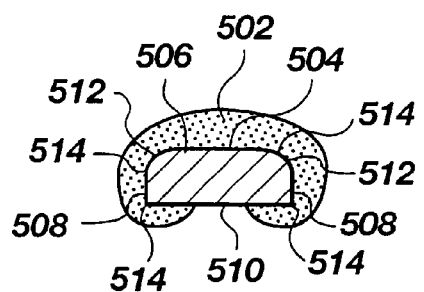

A controlled amount of conductive material 222 can be applied to pads 224 (shown as bond pads) on a first component 226 (shown as a flip-chip type semiconductor) and/or to pads 228 (shown as trace pads) on a second component 232 (shown as a printed circuit board) using the apparatus and methods of the present invention. The first component pads 224 and the second component pads 228 can be aligned and electrically attached together, as shown in FIG. 42.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. An apparatus for applying adhesive material to a semiconductor element, comprising:

an adhesive reservoir comprising a housing having an adhesive inflow chamber and an adhesive pool chamber, said adhesive pool chamber in fluid communication with said adhesive inflow chamber and configured for applying adhesive material adjacently above an upwardly-facing opening of the adhesive pool chamber; and at least one stop lacking any opening therethrough, said at least one stop for spacing a portion of a semiconductor element at a predetermined distance from said upwardly-facing opening of said adhesive pool chamber, said at least one stop located adjacent said adhesive reservoir.

2. The apparatus of claim 1, wherein said at least one stop is attached to said adhesive reservoir.

3. The apparatus of claim 1, wherein said at least one stop is unsecured to said adhesive reservoir.

4. The apparatus of claim 1, wherein said at least one stop comprises a buoyant stop disposed at least in part in said adhesive reservoir.

5. The apparatus of claim 1, further comprising a coating stencil having a plurality of apertures, said coating stencil attached to said adhesive pool chamber such that the only outlet for adhesive material is through said coating stencil apertures.

6. The apparatus of claim 5, wherein said at least one stop is attached to said coating stencil.

7. The apparatus of claim 1, wherein said at least one stop is configured to be adjustable at least vertically in relation to said upward-facing opening of said reservoir.

8. The apparatus of claim 1, wherein said at least one stop adjacent said reservoir is configured for spacing at least a portion of a lead finger of a semiconductor leadframe from said upwardly facing opening.

9. An apparatus for applying a flowable material to semiconductor elements, comprising:

a reservoir comprising a cavity having an upward-facing opening;

a stop adjacent said reservoir for spacing a portion of a semiconductor element a predetermined distance above said upward-facing opening of said cavity; and a pump and control system for supplying flowable material to said reservoir and controlling extrusion of flowable material above said reservoir to a selectable height thereabove for application to a portion of a semiconductor element.

10. The apparatus of claim 9, wherein said stop is attached to said reservoir.

11. The apparatus of claim 9, wherein said stop is unsecured to said reservoir.

12. The apparatus of claim 9, wherein said stop comprises a buoyant stop at least partially disposed in said reservoir.

13. The apparatus of claim 9, further comprising a cover plate disposed over said upward-facing cavity opening and defining a plurality of apertures therethrough.

14. The apparatus of claim 9, wherein said stop is configured to be adjustable at least vertically in relation to said upward-facing opening of said reservoir.

15. The apparatus of claim 9, wherein said stop adjacent said reservoir is configured for spacing at least a portion of a lead finger of a semiconductor leadframe from said upwardly facing opening.

16. An apparatus for applying viscous material to semiconductor elements, comprising:

a reservoir comprising a cavity having an upward-facing opening;

a stop adjacent said reservoir for spacing a portion of a semiconductor element predetermined distance above said upward-facing opening of said cavity; and a pump and control system for supplying a viscous material to said reservoir and controlling extrusion of said viscous material in said reservoir to a selectable height above said upward-facing opening of said cavity of said reservoir for application to a portion of said semiconductor element.

17. The apparatus of claim 16, wherein said stop is attached to said reservoir.

18. The apparatus of claim 16, wherein said stop is unsecured to said reservoir.

19. The apparatus of claim 16, wherein said stop comprises a buoyant stop at least partially disposed in said reservoir.

20. The apparatus of claim 16, further comprising a cover plate disposed over said upward-facing cavity opening and defining a plurality of apertures therethrough.

21. The apparatus of claim 20, wherein said stop is attached to said cover plate.

22. The apparatus of claim 16, wherein said stop is configured to be adjustable at least vertically in relation to said upward-facing opening of said reservoir.

23. The apparatus of claim 16, wherein said stop adjacent said reservoir is configured for spacing at least a portion of a lead finger of a semiconductor leadframe from said upwardly facing opening.

* * * * *

UNITED STATES PATENT AND TRADEMARK OFFICE
CERTIFICATE OF CORRECTION

PATENT NO.   : 6,336,974 B1
DATED        : January 8, 2002
INVENTOR(S)  : Syed Sajid Ahmad It is certified that error appears in the above-identified patent and that said Letters Patent is hereby corrected as shown below:

Column 2,
Line 8, change "i-e.," to -- i.e., --

Column 4,
Line 29, change "Ahmed" to -- Ahmad --
Line 31, change "disclosed" to -- discloses --

Column 9,
Line 55, insert a period after "thereof"

Column 13,
Line 65, change "upward-facing" to -- upwardly-facing --and after "of" and before "said" insert -- said adhesive pool chamber of --

Column 14,
Line 2, insert a hyphen between "upwardly" and "facing"
Line 30, change "upwardly facing" to -- upward-facing --
Line 58, after "said" and before "reservoir" insert -- cavity of said --
Line 62, change "upwardly facing" to -- upward-facing --

Signed and Sealed this

Eighth Day of July, 2003

JAMES E. ROGAN
*Director of the United States Patent and Trademark Office*